(12) United States Patent
Bhushan et al.

(10) Patent No.: US 7,583,125 B2
(45) Date of Patent: Sep. 1, 2009

(54) METHODS AND APPARATUS FOR PULSE GENERATION USED IN CHARACTERIZING ELECTRONIC FUSES

(75) Inventors: Manjul Bhushan, Hopewell Junction, NY (US); Mark B. Ketchen, Hadley, MA (US); Chandrasekharan Kothandaraman, Hopewell Junction, NY (US); Edward P. Maciejewski, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/923,916

(22) Filed: Oct. 25, 2007

(65) Prior Publication Data

US 2008/0048761 A1 Feb. 28, 2008

Related U.S. Application Data

(62) Division of application No. 11/037,612, filed on Jan. 18, 2005, now Pat. No. 7,295,057.

(51) Int. Cl.
*H03K 3/00* (2006.01)

(52) U.S. Cl. .................................... 327/291; 327/295
(58) Field of Classification Search .................. None
See application file for complete search history.

(56) References Cited

U.S. PATENT DOCUMENTS

| | | | |
|---|---|---|---|
| 6,067,648 A * | 5/2000 | Hunter et al. | 714/718 |
| 6,624,499 B2 | 9/2003 | Kothandaraman et al. | |
| 6,856,558 B1 * | 2/2005 | Proebsting et al. | 365/193 |
| 6,879,201 B1 * | 4/2005 | Chan | 327/291 |

OTHER PUBLICATIONS

C. Kothandaraman et al., "Electrically Programmable Fuse (eFuse) Using Electromigration in Silicides," IEEE Electron Device Letters, vol. 23, No. 9, pp. 523-525, Sep. 2002.

* cited by examiner

*Primary Examiner*—Cassandra Cox
(74) *Attorney, Agent, or Firm*—Kenneth R. Corsello; Ryan, Mason & Lewis, LLP

(57) ABSTRACT

An integrated circuit device having at least one fuse capable of being blown in order to provide measurements of fuse current-voltage characteristics is provided. The integrated circuit device also provides at least one pulse generation circuit associated with the fuse and capable of generating a pulse to blow the fuse through one or more DC input signals.

14 Claims, 6 Drawing Sheets

| a1 | 1 | 1 | 0 | 0 |
|---|---|---|---|---|
| a2 | 1 | 0 | 1 | 0 |
| PULSEWIDTH | 0.7μs | 11μs | 200μs | 3.2ms |

| TIME STEP | 1 | 2 | 3 | 4 | 5 |
|---|---|---|---|---|---|
| SEL | 1 | 1 | 1 | 1 | 1 |
| ARM | 0 | 0 | 0 | 1 | 1 |
| LAUNCH | 0 | 1 | 0 | 0 | 1 |

METHODS AND APPARATUS FOR PULSE GENERATION USED IN CHARACTERIZING ELECTRONIC FUSES

CROSS REFERENCE TO RELATED APPLICATION

This application is a divisional of U.S. application Ser. No. 11/037,612, filed on Jan. 18, 2005, now issued as U.S. Pat. No. 7,295,057, the disclosure of which is incorporated by reference herein.

FIELD OF THE INVENTION

The present invention is related to the field of integrated circuits and, more particularly, to techniques for characterizing a fuse through blowing the fuse and measuring the pre-blow and post-blow current-voltage characteristics.

BACKGROUND OF THE INVENTION

The technology referred to as "e-fuse," combines software algorithms and microscopic electrical fuses to produce chips able to regulate and adapt to their own actions in response to changing conditions and system demands. More specifically, an e-fuse reroutes chip logic, much the way highway traffic patterns can be altered, by opening and closing new lanes. The use of an e-fuse plays an important role in the post-fabrication personalization of microelectronic circuitry.

The e-fuse technology constantly monitors chip functionality and initiates corrective actions by tripping or blowing inexpensive, simple electrical fuses that are designed into the chip. The blown fuses help the chip to control individual circuit speed, manage power consumption, and repair unexpected, and potentially costly flaws. E-fuses may be used to invoke redundancy, to remove or replace defective bits in memory, or to permanently select certain regions of circuitry to personalize chips for specific applications.

It is important that e-fuses function flawlessly with appropriate values of pre-blow and post-blow resistance. In order to verify the proper operation of an e-fuse, characterization is achieved by measuring current-voltage characteristics of the fuse, then blowing the e-fuse and measuring the current-voltage characteristics of the fuse again. In order to blow the e-fuse a controlled amount of current is delivered to the fuse for a fixed amount of time, with specific control over the rise and fall times of the current. More specifically, the fuse blowing process requires the application of a pulse having fast rise and fall times and a duration of one to a few hundred microseconds. Rise and fall times are preferably on the order of 100 picoseconds. Appropriate test structures may be incorporated into chip designs in order to allow for the monitoring of fuse properties, such as the pre-blow and post-blow resistance.

Presently, the characterization of e-fuses requires a functional tester or a sophisticated external pulse generator unit, along with an appropriate wide-bandwidth probe card. In using a functional tester, the function of characterizing e-fuses must compete for the resources of the functional tester with a wide spectrum of traditional functional test and debug work. At best, functional testing is performed on a small sampling of the hardware, although the feedback for manufacturing and development purposes is not immediate. Alternatively, the incorporation of pulse generator units and wide bandwidth probe cards for every inline parametric tester is very expensive.

SUMMARY OF THE INVENTION

The present invention provides techniques using direct current (DC) inputs and outputs for characterizing a fuse through blowing the fuse and measuring the pre-blow and post-blow current-voltage characteristics.

For example, in one aspect of the invention, an integrated circuit device comprises at least one fuse capable of being blown in order to provide measurements of one or more current-voltage characteristics of the fuse. The integrated circuit device also comprises at least one pulse generation circuit associated with the fuse and capable of generating a pulse to blow the fuse through one or more DC input signals.

In an additional aspect of the invention, a pulse generation circuit of an integrated circuit device capable of blowing at least one fuse comprises a first latch that receives at least one DC input signal and creates a leading edge of a pulse. A resetable counter connected to a clock is in communication with the first latch and determines the width of the pulse. A second latch is in communication with the resetable counter and the first latch, and creates a falling edge of the pulse.

In another aspect of the invention, an apparatus for characterizing a fuse of an integrated circuit device comprises an integrated circuit device having at least one fuse and at least one pulse generation circuit. The pulse generation circuit is associated with the at least one fuse and is capable of generating a pulse to blow the at least one fuse through one or more direct current (DC) input signals. The apparatus also comprises measurement circuitry capable of measuring at least one pre-blow current-voltage characteristic of the fuse and at least one post-blow current-voltage characteristic of the fuse.

In an additional aspect of the invention, a technique for characterizing a fuse of an integrated circuit device is provided. At least one pre-blow current-voltage characteristic of the fuse is measured. The fuse is blown with a pulse generation circuit of the integrated circuit device through at least one DC input signal, and at least one post-blow current-voltage characteristic of the fuse is measured.

In another aspect of the invention, a technique for blowing a fuse of an integrated circuit device is provided. At least one DC input signal is received at a pulse generation circuit of the integrated circuit device. A pulse is generated in the integrated circuit device at the pulse generation circuit as a result of the at least one DC input signal. The pulse is transmitted from the pulse generation circuit to a fuse of the integrated circuit device in order to blow the fuse.

Advantageously, the present invention provides a circuit that allows for accurate characterization of e-fuses without the need for functional testers or external pulse generators. The integrated circuit device of the present invention provides for the blowing of e-fuses with a variable-width, on-chip-generated pulse, and the measurement the pre-blow and post-blow fuse current-voltage characteristics. The present invention is self-timed and requires only DC inputs and outputs.

An additional advantage of the present invention is its ability to be implemented using a single metal layer. A single metal layer implementation enhances the versatility of the circuit by providing feedback on e-fuse characteristics very early in the process. This approach also can simplify product design and system level design.

These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

As will be illustrated in detail below, the present invention is related to the field of integrated circuits and, more particularly, techniques for inline generation of a pulse for blowing and characterizing a fuse. The term "blow," as used herein, is intended to include the changing of a fuse from a low resistance state to a high resistance state and the resulting rerouting of digital circuitry. The term "characterization," as used herein, is intended to include the blowing of e-fuses and the measurement of the pre-blow and post-blow e-fuse current-voltage characteristics.

Figure 1:
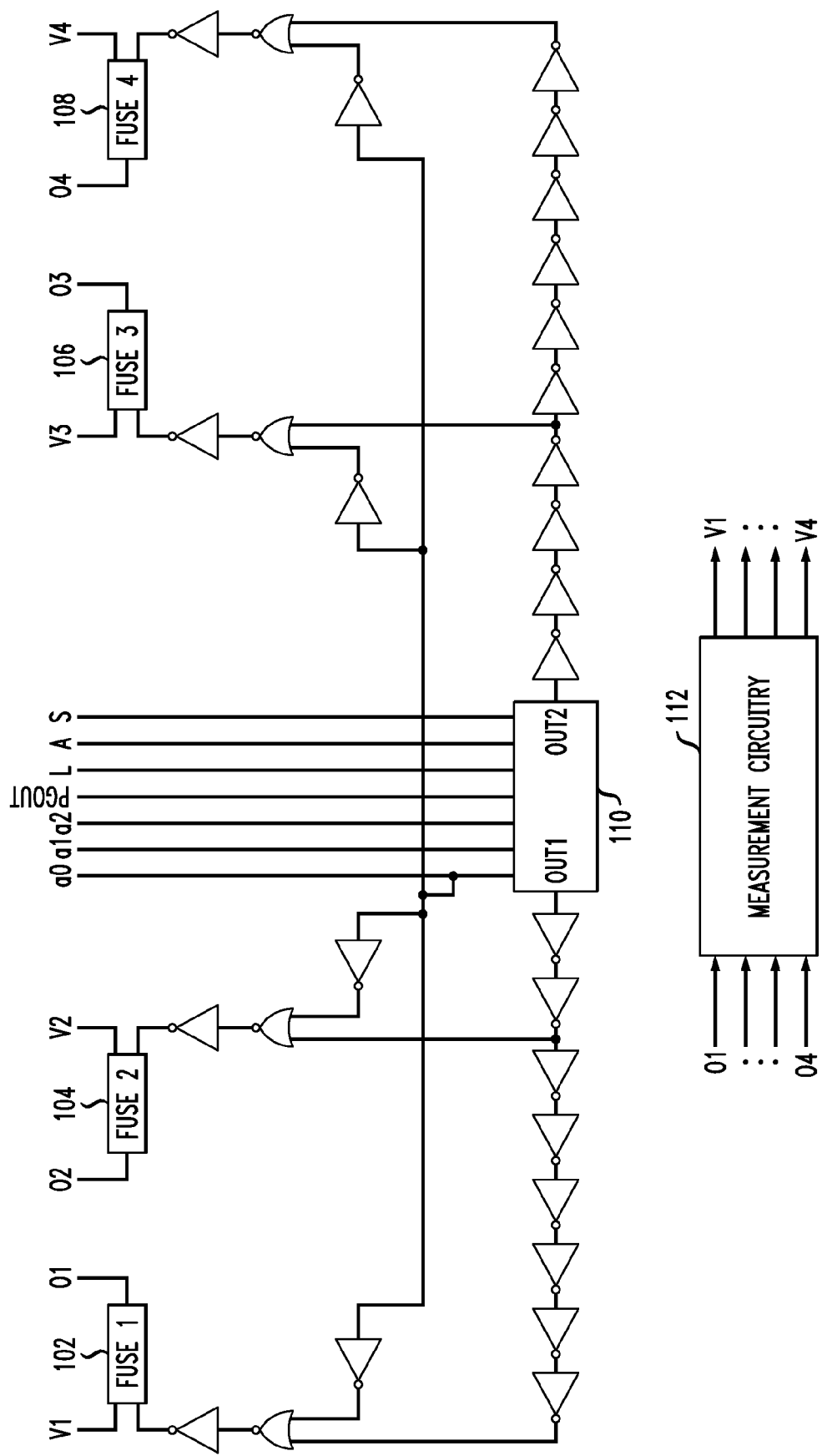
FIG. 1 is a circuit diagram illustrating a circuit for inline characterization of e-fuses, according to an embodiment of the present invention.

Referring initially to FIG. 1, a circuit diagram illustrates a circuit for inline characterization of e-fuses, according to an embodiment of the present invention. The embodiment of the present invention illustrated in FIG. 1, shows four independent e-fuses, first fuse 102 (FUSE1), second fuse 104 (FUSE2), third fuse 106 (FUSE3) and fourth fuse 108 (FUSE4). Each of the fuses has an independent power pad, V1-V4, and an independent fuse_out output pad, O1-O4, allowing current-voltage characteristics of each e-fuse to be individually measured before and after the fuse is blown. The current-voltage characteristics of each e-fuse may be measured through a measurement circuitry 112, from which a small voltage may be applied to independent power pads V1-V4 and to which voltage is received from fuse_out output pads O1-O4. A fuse resistance may then be determined by calculating, for example, (V1−V(O1))/I(V1), where I(V1) is the current flowing into the V1 terminal.

A single centrally located pulse generation circuit 110 is used to blow each e-fuse. More specifically, OUT1 is used to blow first fuse 102 and second fuse 104, while OUT2 is used to blow third fuse 106 and fourth fuse 108. Pulse generation circuit 110 is disposed on the chip and is self-timed, in order to generate a variable-width pulse similar to that from a functional tester or a sophisticated pulse generator unit, but which instead utilizes DC inputs and DC outputs. DC Launch signal L, Arm signal A, Sel signal S, a0, a1 and a2 are inputs to pulse generation circuit 110, while P GOUT, OUT1 and OUT2 are outputs of pulse generation circuit 110. The individual inputs and outputs will be described in greater detail below. The number of inverters and other circuit elements between pulse generation circuit 110 and fuses 102, 104, 106, 108 may vary depending on the desired delay of the circuit.

An embodiment of the present invention may be implemented with two or more metal layers. Another embodiment of the present invention may be implemented in a single metal layer of the integrated circuit device. In this case crossovers may be accomplished with polysilicon or diffusion underpasses.

Figure 2:
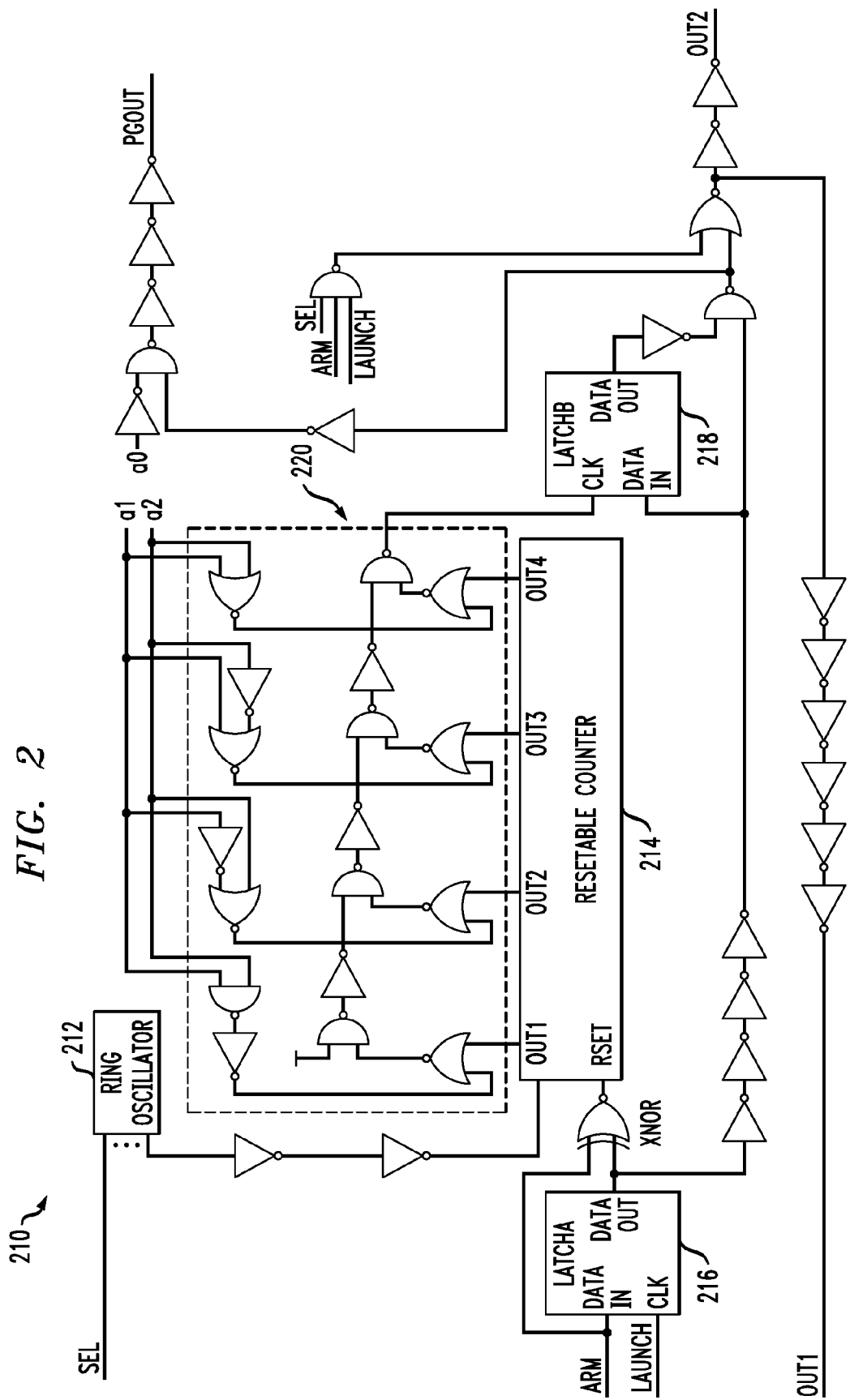
FIG. 2 is a circuit diagram illustrating a pulse generation circuit, according to an embodiment of the present invention.

Referring now to FIG. 2, a circuit diagram illustrates a pulse generation circuit, according to an embodiment of the present invention. This may be considered a detailed description of pulse generation circuit 110 of FIG. 1. Pulse generation circuit 210 includes a ring oscillator 212 that serves as a local clock. Ring oscillator 212 is enabled by the SEL signal, illustrated as S in FIG. 1. Ring oscillator 212 provides the local clock output to a resetable counter 214.

In order to create a sharp leading edge of a pulse a first latch 216 (LATCHA) is used. A "1" is preloaded into the data port of first latch 216 via an ARM signal, illustrated as A in FIG. 1. An ARM=1 signal also ensures that the resetable counter is in the reset mode. The output of first latch 216 remains at "0" until a LAUNCH signal, illustrated as L in FIG. 1, and input to a clock of first latch 216, is of sufficient magnitude. When LAUNCH signal reaches the sufficient magnitude the loaded "1" of first latch 216 is passed to the output, thereby creating a very sharp leading edge of a pulse for e-fuse blowing purposes. This behavior is independent of the rise time or detailed shape of the launch signal itself.

The output from first latch 216 turns off a reset signal and initiates counting of clock cycles by the resetable counter 214. Thus, subsequent events are self-timed with respect to the sharp leading edge of the pulse. Resetable counter 214 counts to a time determined by decoder inputs a1 and a2. Decoder inputs a1 and a2 are entered and transmitted through a decoder circuit 220. The time determined by these inputs is described in more detail below with regard to FIG. 3. Resetable counter 214 includes four outputs, OUT1, OUT2, OUT3 and OUT4, each to decoder circuit 220. Resetable counter 214 and decoder circuit 220 produce an output when a time determined by inputs a1 and a2 is reached. This time delay directly results in the width of the resulting pulse. Resetable counter 214 is described in more detail below with regard to FIGS. 5 and 6.

The output from first latch 216 also results in the preloading of a "1" into a data port of a second latch 218 (LATCHB). When the determined time is reached in resetable counter 214 and decoder circuit 220, a signal is sent to a clock input of second latch 218, awaiting with the preloaded "1". An output from second latch 218 is then inverted and combined with the output from first latch 216 to form a falling edge of the pulse for blowing an e-fuse. The pulse having the prescribed leading edge, pulse width, and failing edge is output to OUT1 and OUT2 for e-fuse blowing purposes. For monitoring purposes the output pulse may be observed at the PGOUT terminal with input a0 set to "0", as will be also be described in more detail below.

Figures 3, 4, 5:
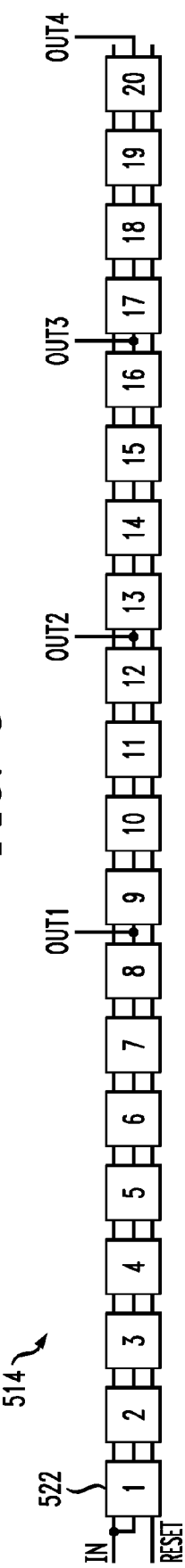
FIG. 3 is a table illustrating output pulse widths for various decoder inputs, according to an embodiment of the present invention.
FIG. 4 is a table illustrating sequential inputs for initializing the circuit and generating a pulse, according to an embodiment of the present invention.
FIG. 5 is a circuit diagram illustrating a resetable counter, according to an embodiment of the present invention.

Referring now to FIG. 3, a table illustrates output pulse widths for various decoder inputs, according to an embodiment of the present invention. As discussed regarding FIG. 2, decoder inputs a1 and a2 determine the amount of time that resetable counter 214 counts, or more specifically, the resulting width of the pulse for blowing an e-fuse. As shown in the table, this embodiment of the present invention illustrates four different times or resulting pulse widths. When both a1 and a2 are set to "1", a pulse width of 0.7 microseconds results. When only a1 is set to "1", a pulse width of 11 microseconds results. When only a2 is set to "1", a pulse width of 200 microseconds results. Finally, when both a1 and a2 are set to "0", a pulse width of 3.2 ms results.

Referring now to FIG. 4, a table illustrates sequential inputs for initializing the circuit and generating a pulse, according to an embodiment of the present invention. In this embodiment of the present invention, input signals SEL, ARM and LAUNCH are utilized in accordance with five time steps. In a first time step, the SEL signal is set to "1" which turns on the ring oscillator. In a second time step, the SEL and LAUNCH signals are both at "1" with ARM at "0." This establishes the output of LATCHA and the data input of LATCHB at "0." In a third time step, only the SEL signal is at "1" with ARM and LAUNCH both at "0." The output of LATCHA and data input of LATCHB remain at "0." The ring oscillator is on and the counter is cyclically counting with the clock input to LATCHB alternating between "1" and "0." This condition establishes the output of LATCHB at "0" and completes the initialization of the pulse generation circuit. In a fourth time step, the SEL and ARM signals are both set to "1". Finally, in a fifth time step, the SEL, ARM and LAUNCH signals are all set to "1," generating the pulse as previously described.

Figure 6:
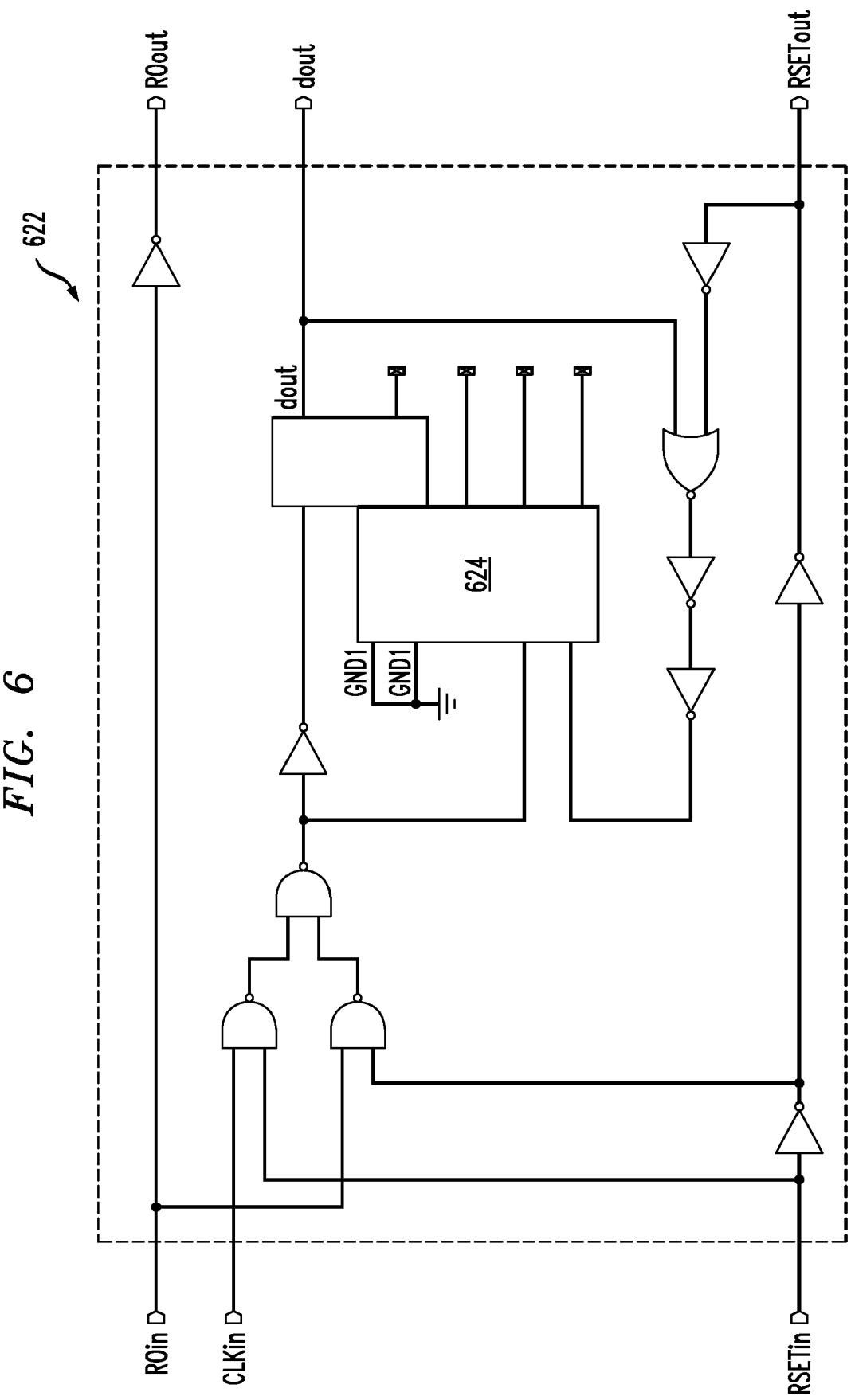
FIG. 6 is a circuit diagram illustrating a single stage of the resetable counter of FIG. 5, according to an embodiment of the present invention.

Referring now to FIG. 5, a circuit diagram illustrates a resetable counter 514, according to an embodiment of the present invention. This may be considered a detailed description of resetable counter 214 in FIG. 2. Resetable counter 514 includes 20 divide by 2 stages 522 and four outputs. OUT1 occurs after stage 8; OUT2 occurs after stage 12; OUT3 occurs after stage 16; and OUT4 occurs after stage 20. The individual stages 522 are identical and a single stage 622 is illustrated in FIG. 6, according to an embodiment of the present invention. The design of single stage 622 of resetable counter 514 is that of a conventional ripple counter incorporating a master-slave latch 624 and robust reset circuitry. A data out signal dout from one stage becomes a clock in signal clkin for the next. For the first stage, clkin and a ring oscillator input signal R0in are connected together shown as in FIG. 5. A reset signal from first latch 216 connects RSETin terminal of the first stage of the resetable counter. R0n and RESTin of subsequent stages connect to R0out and RSETo, respectively of the previous stage. The counter is held in reset mode when RESET=0 and it actively counts when RESET=1. The nominal period of the clock ring oscillator circuit in 90 nanometer partially depleted SOI technology used in this design is about 5.5 nanoseconds, which leads to the pulse widths shown in the table of FIG. 3.

Figure 7:
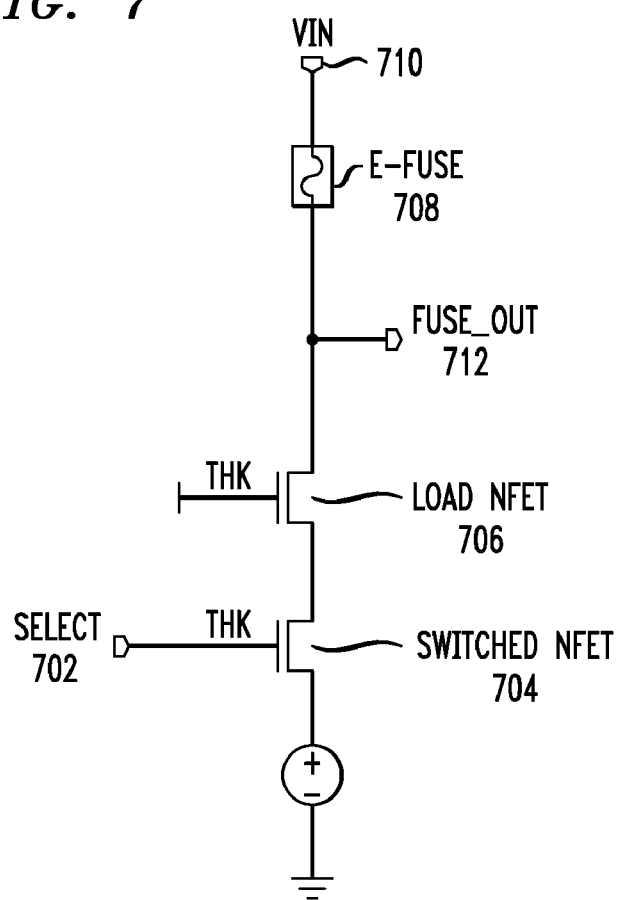
FIG. 7 is a circuit diagram illustrating an e-fuse and associated NFETs, according to an embodiment of the present invention.

Referring now to FIG. 7, a circuit diagram illustrates an e-fuse and associated thick gate oxide, negative channel field effect transistors (NFETs), according to an embodiment of the present invention. This may be considered a detailed description of first fuse 102, second fuse 104, third fuse 106 or fourth fuse 108 of FIG. 1. The output from pulse generation circuit 110 (OUT1 or OUT2 depending on the fuse), drives a select terminal 702 connecting to a gate of a switching NFET 704. A gate of a load NFET 706 is preferably maintained at a power supply voltage VDD of the driver that drives the gate of the switching NFET. More specifically, the gates of both thick oxide NFETs are driven with a voltage of magnitude VDD.

In order to blow a fuse 708, an input voltage Vin 710 is 3V, which equals 2×VDD of this driver. Load NFET 706 serves to ensure that a voltage of no greater than VDD appears across the gate oxide of either thick oxide NFET. A fuse_out terminal 712 connects to a dedicated output pad through a low capacitance, 10 kiloOhm polysilicon resistor and thus minimally perturbs the situation during the fuse blowing operation.

With both NFETs turned on, one can directly measure the DC current-voltage characteristics of the e-fuse, before and after the blowing process. This is accomplished by applying a small voltage Vin and measuring the current through this circuit and the voltage drop across the fuse, Vin−V(fuse_out).

In an illustrative embodiment of the present invention, a power supply VDD of magnitude approximately 1V may power pulse generation circuit 110. Separate power supplies VR and VL may power buffers between the pulse generation circuit and the fuses as well as the drivers that drive the thick oxide switching NFETs in the e-fuse circuits. This allows one to vary the voltage applied to the thick oxide NFET gates independent of the central VDD. All three of these power sectors share a common ground. Second fuse 104 and third fuse 106, of FIG. 1, share a common ground with VDD, VR and VL, while in this illustrative embodiment first fuse 102 and fourth fuse 108 have independent ground pads.

By setting a0 to "0" one can, for diagnostic purposes, directly measure the output pulse without applying it to any of the e-fuse circuits. Also with a0 set to "0" the DC current-voltage characteristics of the e-fuse can be measured with both thick oxide NFETs turned on. Finally, with a0 set to "1" a generated pulse will blow an e-fuse that is powered up, while not affecting unpowered e-fuses.

In the embodiment described thus far, the characteristics of four separate e-fuses may be obtained. It may also be of interest to obtain the characteristics of a larger collection of e-fuses in order to compile statistics of e-fuse characteristics. In such a case an array of 2*n e-fuses may be configured in parallel, sharing a common power supply Vc and a common ground. Each individual e-fuse circuit maintains the configuration shown in FIG. 7, having a dedicated switching NFET, non-switching NFET, and output tap point.

The outputs of an n-input decoder are used to connect the gate of the non-switching NFET of the selected e-fuse to VDD (with all others held at ground) and to enable the path from the pulse generation circuit to the gate of the switching NFET of the selected fuse (while the gates of all the other switching NFETs are held at ground). The inputs of the decoder may then be coordinated with those to the pulse generation circuit such that all fuses of the array are systematically blown with successive pulses from the pulse generation circuit. Before and after the blow process the decoder outputs can be used to allow individual measurement of the current-voltage characteristics of each selected fuse. This may be accomplished as previously described with the circuit in FIG. 1, with the additional features of decoder mediated e-fuse (NFET) selection and decoder mediated multiplexer circuitry that connects only the selected fuse_out tap point to a single common output terminal.

Figure 8:
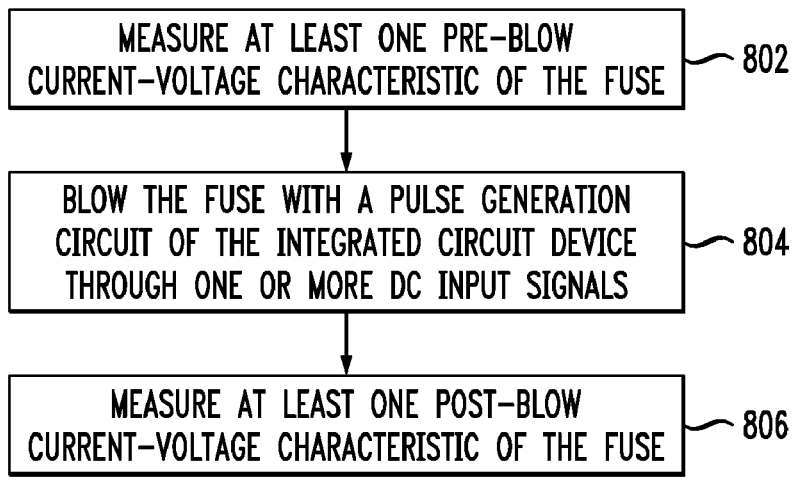
FIG. 8 is a flow diagram illustrating a fuse characterization methodology, according to an embodiment of the present invention.

Referring now to FIG. 8, a flow diagram illustrates a fuse characterization methodology, according to an embodiment of the present invention. The methodology begins at block 802 where pre-blow current-voltage characteristics of a fuse are measured. In block 804, the fuse is blown with a pulse generation circuit of the integrated circuit device through DC input signals. In block 806, post-blow current-voltage characteristics of the fuse are measured, terminating the methodology.

Figure 9:
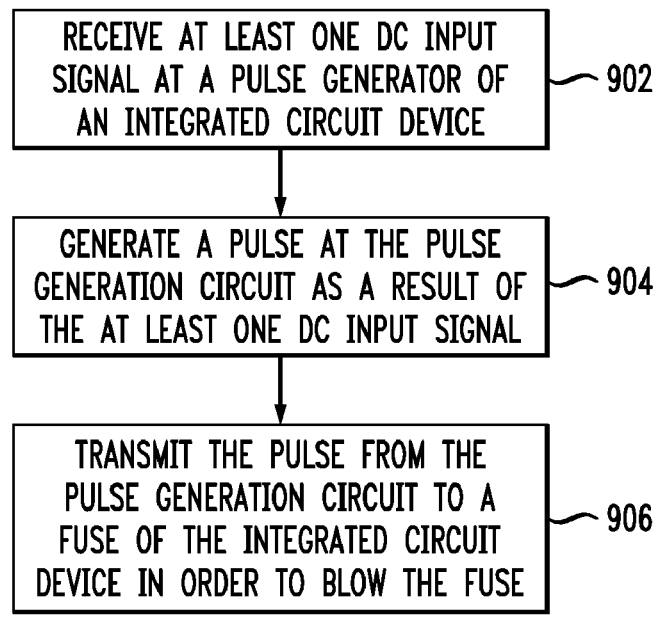
FIG. 9 is a flow diagram illustrating a fuse blowing methodology, according to an embodiment of the present invention.

Referring now to FIG. 9, a flow diagram illustrates a fuse blowing methodology, according to an embodiment of the present invention. This may be considered a detailed description of block 804 in FIG. 8. The methodology begins at block 902 where at least one DC input signal is received at a pulse generation circuit of an integrated circuit device. In block 904, a pulse is generated at the pulse generation circuit as a result of the at least one DC input signal. In block 906, the pulse is transmitted from the pulse generation circuit to a fuse of the integrated circuit device in order to blow the fuse, thereby terminating the methodology.

Figure 10:
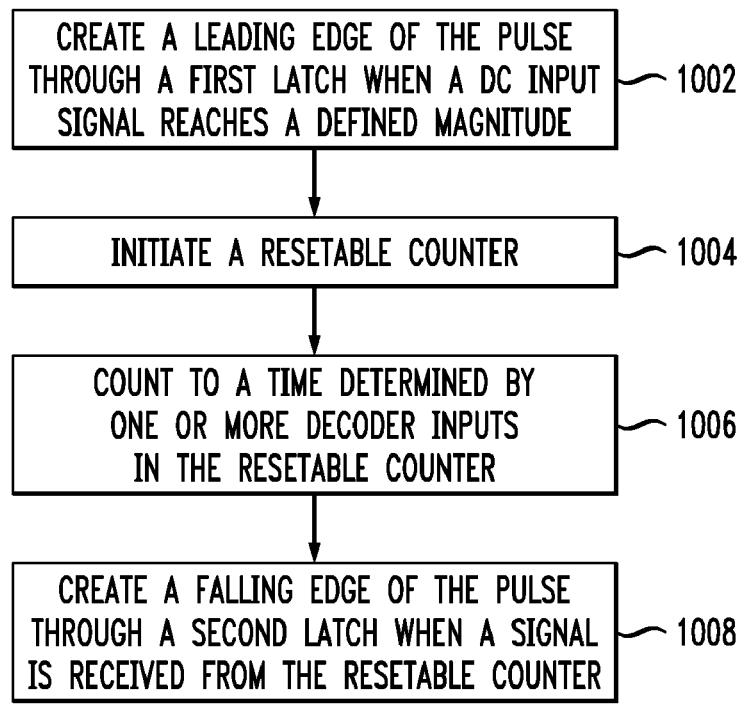
FIG. 10 is a flow diagram illustrating a pulse generation methodology, according to an embodiment of the present invention.

Referring now to FIG. 10, a flow diagram illustrates a pulse generation methodology, according to an embodiment of the present invention. This may be considered a detailed description of block 904 of FIG. 9. The methodology begins at block 1002, where a sharp leading edge of the pulse is created through a first latch when a DC input signal reaches a defined magnitude. As described above, specifically with regard to FIG. 2, a "1" is preloaded into the first latch via an ARM signal and a LAUNCH signal is input to a clock of the first latch. When the LAUNCH signal reaches a sufficient magnitude, the preloaded "1" is passed to the output, creating a sharp leading edge of a pulse.

In block 1004, a resetable counter is initiated. As described above, with regard to FIG. 2, a resetable counter receives a clock signal from a ring oscillator and a reset signal from the first latch. When the reset signal is received, the reset of the resetable counter is turned off, and the local clock of the resetable counter is initiated. Events are timed with respect to the time of the sharp leading edge of the pulse.

In block 1006, a time determined by one or more decoder inputs is counted to by the resetable counter. Decoder inputs are entered and transmitted through a decoder circuit. The resetable counter provides four outputs to the decoder circuit so that a time prescribed by the inputs may be counted to, before a signal is output, thereby terminating the pulse.

In block 1008, a falling edge of the pulse is created through a second latch when a signal is received from the resetable counter, thereby terminating the methodology. The output from the first latch results in the preloading of a "1" in the second latch. When a signal is received from resetable counter, the preloaded "1" is output and inverted. The output from second latch is then combined with the output from first latch to create the falling edge.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A pulse generation circuit of an integrated circuit device capable of blowing at least one fuse, the pulse generation circuit comprising:
    a first latch that receives at least one direct current (DC) input signal and creates a leading edge of a pulse as a function of at least one control signal supplied to the first latch;
    a resetable counter in communication with the first latch that determines the width of the pulse; and
    a second latch in communication with the resetable counter and the first latch that creates a falling edge of the pulse;
    wherein the pulse generation circuit comprises at least one ring oscillator that provides a local clock.

2. The pulse generation circuit of claim 1, further comprising at least one ring oscillator that provides a local clock to the resetable counter.

3. The pulse generation circuit of claim 1, further comprising a decode circuit in communication with the resetable counter that provides one or more decoder inputs to determine the width of the pulse.

4. The pulse generation circuit of claim 1, wherein the pulse generation circuit is capable of generating pulses of variable pulse widths.

5. The pulse generation circuit of claim 1, wherein the pulse generation circuit is self-timed.

6. The pulse generation circuit of claim 1, wherein the pulse generation circuit is implemented in two or more metal layers of the integrated circuit device.

7. The pulse generation circuit of claim 1, wherein the pulse generation circuit is implemented in a single metal layer of the integrated circuit device.

8. A method of generating a pulse in an integrated circuit device for use in blowing a fuse of the integrated circuit device, comprising the steps of:
    creating a leading edge of the pulse through a first latch receiving a direct current (DC) input signal when at least one control signal supplied to the first latch reaches a defined magnitude;
    counting to a determined time at a resetable counter to create a width of the pulse;
    creating a falling edge of the pulse through a second latch when a signal is received from the resetable counter; and
    initiating the resetable counter, wherein the step of initiating the resetable counter comprises receiving a clock input at the resetable counter from a ring oscillator and turning a reset signal of the resetable counter off in response to input associated with the leading edge.

9. The method of claim 8, wherein the step of creating a leading edge comprises the steps of:
    preloading a first input signal into a first latch;
    inputting a second input signal into a clock of the first latch; and
    outputting the preloaded first input signal when the second input signal reaches a defined magnitude.

10. The method of claim 8, wherein the step of counting to a time at the resetable counter comprises the steps of:
    receiving one or more inputs in a decoder circuit;
    providing output from the resetable counter to the decoder circuit; and
    providing output from the resetable counter and the decoder circuit when a time specified by the one or more inputs is reached.

11. The method of claim 8, wherein the step of creating a falling edge of a pulse comprises the steps of:
    preloading an output signal from the first latch into the second latch;
    receiving a signal from the resetable counter that the determined time has been reached; and
    outputting the preloaded output signal from the second latch.

12. The method of claim 11, wherein the step of creating a falling edge of a pulse further comprises the steps of:
    inverting the output signal from the second latch; and
    combining the inverted output signal from the second latch with the output signal from the first latch to form a falling edge of a pulse.

13. A method of generating a pulse in an integrated circuit device for use in blowing a fuse of the integrated circuit device, comprising the steps of:

creating a leading edge of the pulse through a first latch receiving a direct current (DC) input signal when at least one control signal supplied to the first latch reaches a defined magnitude;
counting to a determined time at a resetable counter to create a width of the pulse; and
creating a falling edge of the pulse through a second latch when a signal is received from the resetable counter; wherein, in the step of counting to a determined time, the time is determined by one or more decoder inputs.

14. The method of claim 13, wherein the step of counting to a determined time further comprises the step of inputting one or more signals into a decoder circuit in communication with the resetable counter.

* * * * *